United States Patent [19]

Plunkett

[11] Patent Number: 5,043,686

[45] Date of Patent: Aug. 27, 1991

[54] ADAPTIVE POWER LINE NOISE FILTER AND SWITCH FOR AUDIO REPRODUCTION EQUIPMENT

[75] Inventor: Bradley J. Plunkett, Granada Hills, Calif.

[73] Assignee: Harman International Industries, Inc., Northridge, Calif.

[21] Appl. No.: 324,006

[22] Filed: Mar. 14, 1989

[51] Int. Cl.$^5$ .............................................. H03H 7/00
[52] U.S. Cl. ..................................... 333/181; 381/94; 363/39
[58] Field of Search .................. 333/12, 17.1, 18, 101, 333/181, 262; 381/94, 93; 323/286; 363/39, 44, 45, 89; 328/520

[56] References Cited

U.S. PATENT DOCUMENTS

| | | | |
|---|---|---|---|
| 3,353,080 | 11/1967 | Santelmann, Jr. | 363/45 X |
| 3,818,244 | 6/1974 | Dolby et al. | 333/18 X |
| 3,989,897 | 11/1976 | Carver | 333/17.1 X |
| 4,327,319 | 4/1982 | Swisher et al. | 363/46 X |
| 4,580,112 | 4/1986 | Winslow et al. | 333/181 X |

*Primary Examiner*—Eugene R. LaRoche
*Assistant Examiner*—Seung Ham
*Attorney, Agent, or Firm*—Jones, Day, Reavis & Pogue

[57] ABSTRACT

A filter circuit for reducing power line noise to audio reproduction equipment. Audio reproduction equipment requires a power source without excessive line noise; however, power sources, particularly in the automotive environment, often generate a substantial amount of noise which can degrade audio reproduction quality. The present invention utilizes a filter circuit which regulates and smooths the power in line between the power source and the audio equipment. The regulation and degree of filtering is further controlled by feedback from the power output and/or from the audio output to provide a sufficient quantity of filtering at various audio levels without affecting the power transmission to the audio equipment through excessive power loss. The power output after filtering is sampled and compared to a reference voltage to create an error signal. The degree of filtering is then adjusted in response to the value of the error signal to provide appropriate filtering without excessive power loss. The audio feedback is utilized to regulate the amount of filtering to decrease the filtering and decrease the voltage loss during high audio output, and to increase filtering during low audio output to provide the necessary line noise conditioning for various audio conditions.

16 Claims, 3 Drawing Sheets

ADAPTIVE POWER LINE NOISE FILTER AND SWITCH FOR AUDIO REPRODUCTION EQUIPMENT

BACKGROUND OF THE INVENTION

1. Field of the Invention

The present invention relates to filters for reducing unwanted electrical noise within audio reproduction equipment and more particularly, to power line noise filters for use in conjunction with audio reproduction equipment.

2. Description of the Prior Art

The audio reproduction quality of electronic audio equipment is often degraded by the effects of noise in the power line feeding the equipment. If the power is supplied in an automotive environment, there is often a significant level of line noise. This noise can originate from a number of sources within a vehicle's electrical power system, the most common source being the vehicle's alternator, which may cause electrical noise from the brush contacts and will cause power line ripple due to the A.C. to D.C. conversion step inherent in alternator designs. This power line noise and/or ripple can manifest itself as a whistle, a whine or a hiss at the output of audio reproduction equipment connected to the power source. The frequency of the noise and therefore of the resultant audio disturbance will often vary with engine speed and significantly degrades the quality of the perceived audio output.

Heretofore, many attempts have been made to reduce the effects of line noise on audio reproduction characteristics. Commonly, resistive, inductive and capacitive elements are used to construct power line filters. These devices or methods have been at least partially satisfactory in the past in reducing line noise to provide acceptable audio reproduction characteristics. However, in order to filter out relatively low frequency alternator ripple, large inductors and large capacitors are typically required, typically resulting in high power loss. Further, the components are costly and require considerable space, making them incompatible with various integrated component fabrication techniques. Moreover, certain equipment, such as high power audio amplifiers which create high current drains, will require even larger scale filter components which require considerable space and create correspondingly greater losses and added expense.

Many automotive stereo amplifiers, for example, draw in excessive of 20 amps. At currents in this range, a tenth of an ohm of resistance in a filter coil will result in a two volt drop in the power supply line voltage. Since power loss is dependent upon the square of the voltage loss, a two volt drop in a typical twelve volt system will result in a 31% power reduction. The seriousness of the resultant power loss in terms of reduced performance and audio fidelity is readily apparent.

In addition to the need for effective, efficient power line filtering, audio amplification equipment must be provided with circuitry for switching the equipment off and on. When amplification is desired, it becomes necessary to switch the amplification means on to provide appropriate audio signal level enhancement. After amplification is no longer necessary or desired, the amplification must be switched off. In present automotive audio equipment, a low power, low level signal typically is produced from a microprocessor or light duty switch within the radio to signal the requirement for audio amplification. This low level control signal is received by the amplifier, and the switching is often implemented by the use of a relay. However, relays can add unnecessary expense, size, weight, and power consumption to an audio system. With present electronic packaging which is optimized for light weight and compact size, more efficient switch circuitry is preferable.

SUMMARY OF THE INVENTION

The present invention is summarized in that an adaptive power line noise filter for an audio reproduction system includes a filter network which may be selectively bypassed in response to a control signal from a feedback network responsive to the audio signal output level, whereby efficient filtering is provided at low audio signal levels and low loss power transmission is provided at high audio signal levels. More specifically, a field effect transistor is utilized to smooth the power line output, and feedback circuitry from the filtered power line and/or the audio output is utilized to regulate the degree of filtering of power line noise and the extent of concomitant direct current losses through the filter circuit.

It is an object of the present invention to reduce or substantially eliminate undesirable power line noise in an audio reproduction system without the use of physically large scale coils and/or capacitors.

It is another object of the present invention to provide low cost, compact, efficient and inexpensive circuitry for the reduction of power line noise in an audio reproduction system.

It is yet a further object of the present invention to provide an adaptive topology which can be adjusted with a control signal to function as a efficient regulator and filter or as a virtual no loss switch dependant upon the status on the control signal.

The present invention has the further object to provide an adaptive power line filter, the characteristics of which are variable in response to control signals derived from the outputs of audio amplifying devices.

Another object of this invention is to filter on audio system power line in a highly efficient manner at low audio signal levels and to transmit power with virtually no losses at high audio signal levels.

It is still another object of the present invention to provide an easily integrated noise filter circuit utilizing low cost, low power components to reduce or substantially eliminate power line induced noise in an audio reproduction system.

It is a further object of the present invention to provide a low cost, low power consumption switch for activation of an audio amplification system or amplifier.

The present invention is advantageous over the prior art in enabling effective and efficient power line filtering in an audio reproduction system, avoiding excessive power losses particularly at high audio levels, in reducing the size and cost of required filter components, in facilitating integrated circuit fabrication to the system, and in eliminating power control relays.

Other objects and advantages of the present invention will become apparent from the following description of the preferred embodiments when taken in conjunction with the accompanying drawings.

DESCRIPTION OF THE PREFERRED EMBODIMENT

Figure 1:
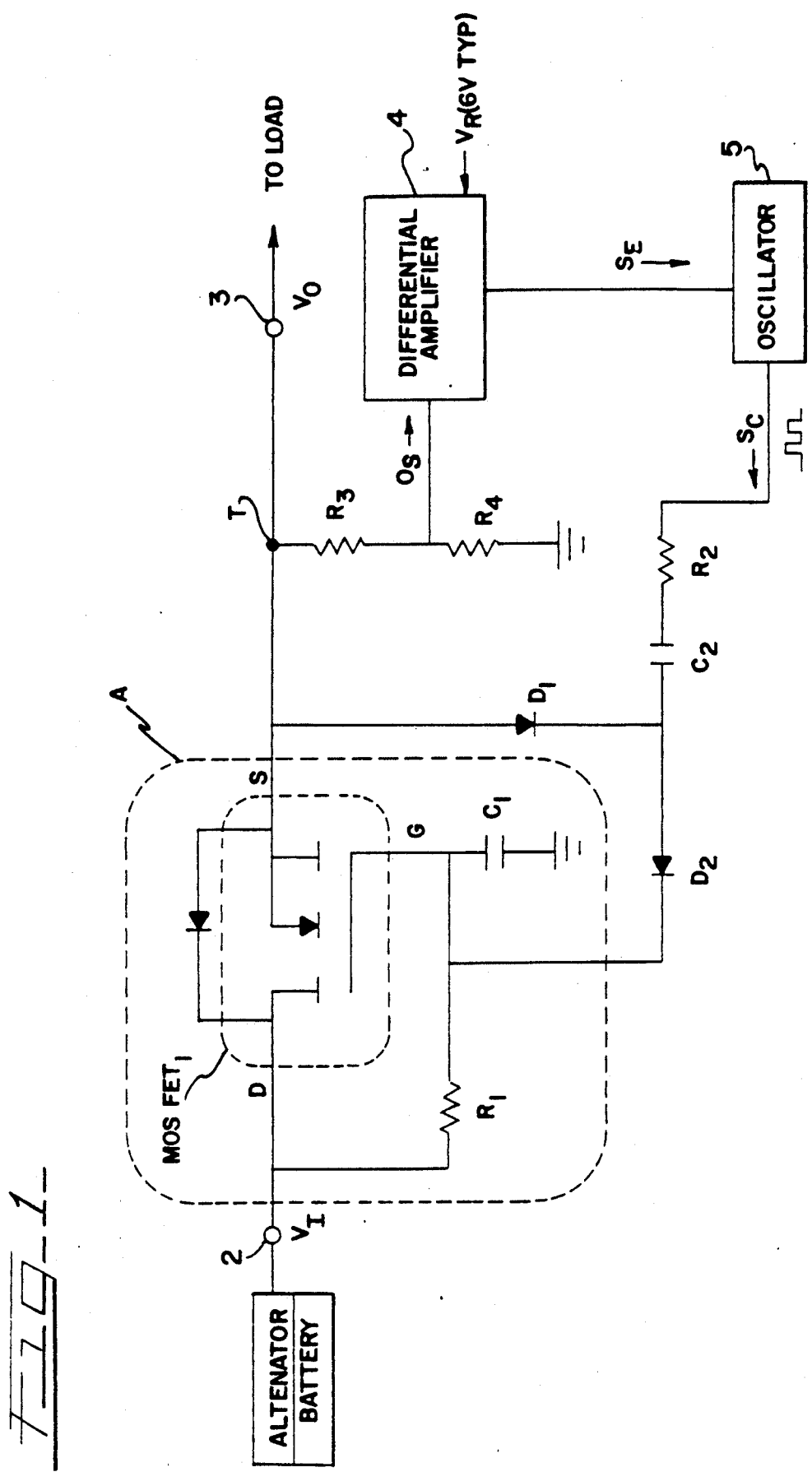
FIG. 1 is a schematic diagram of a first embodiment of an adaptive power line filter in accordance with the present invention.
Figure 2:
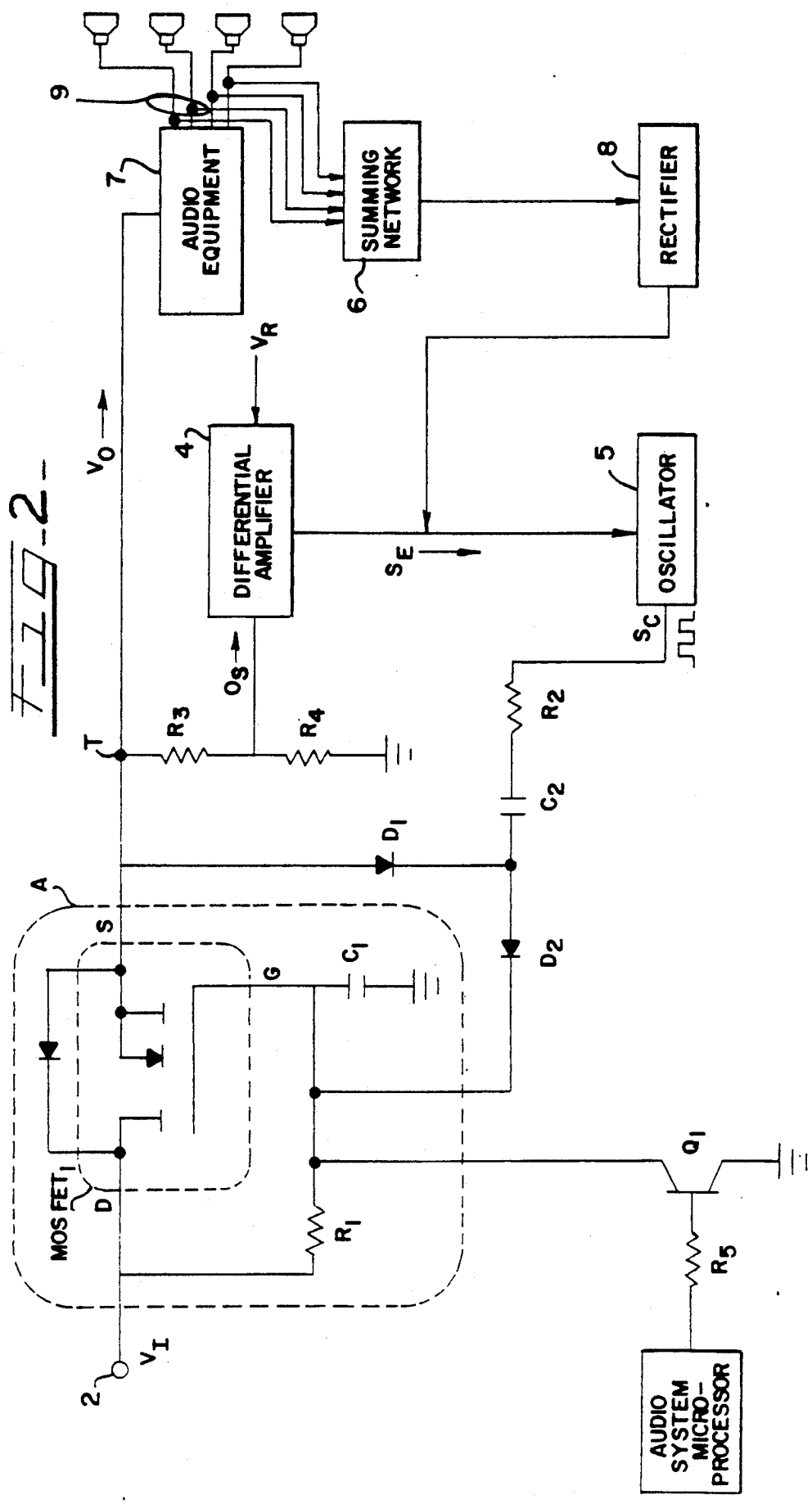
FIG. 2 is a schematic diagram of the circuitry of a further embodiment of the present invention including audio signal feedback and power supply activating networks.

The present invention, as illustrated in FIG. 1 and 2, utilizes an MOS field effect transistor MOS $FET_1$ for controlling the current flow between the input 2 from a suitable power source, such as a battery and alternator, and the output 3 to the load. The device also utilizes a resistor/capacitor network $R_1$ and $C_1$ combined with $FET_1$ so that a capacitor multiplier type filter is implemented with the $FET_1$ configured as a source follower. In this manner, the output at terminal S of the $FET_1$ is a highly filtered replication of the input at terminal D. Without feedback, a 2 to 4 volt drop may be experienced across the FET due to the threshold of conduction of the FET. As capacitor $C_1$ is charged through resistor $R_1$ the $FET_1$ is caused to provide a smooth power output at terminal 5 from the potentially noisy input at terminal D from the alternator.

This portion of the circuitry illustrated in FIGS. 1 and 2 and designated A provides exceedingly effective filtering of the alternator output. However, the power line experiences an undesirable and excessive voltage drop. The voltage drop can have a significant effect on the performance of audio equipment especially at high power demands for the audio system. To reduce the negative effects at high power usage, a comparator/variable frequency oscillator network has been added, as best described with reference to FIG. 1.

In FIG. 1, the differential amplifier 4 and variable frequency oscillator 5 taught by the present invention reduce the disadvantages associated with the voltage drop caused through utilization of the MOS $FET_1$ filter circuit. The feedback provided by the circuitry, as detailed below, provides increased conductivity across the MOS $FET_1$ during higher power demands by the audio system. The increased conduction of the MOS $FET_1$ while providing a greater percentage of power transmission does provide decreased filtering of line noise. However, the decrease in filtering is acceptable due to the acoustic masking affect of music at higher audio volume levels.

At high amplifier volume settings, filtering is not important, due to the natural masking effect of amplified audio material. This psycoacoustic effect has been extensively exploited by Dolby, Blackmer and others teaching various noise reduction means for audio equipment. The present invention teaches circuitry whereby the amount of filtering is automatically adjusted in relation to the audio volume level and amplifier power consumption.

As illustrated in FIGS. 1 and 2, a tap from the output voltage of the MOS $FET_1$ is taken at point T. This output voltage signal is then divided by resistors $R_3$ and $R_4$ and forms an output sample $O_S$ fed into differential amplifier 4. A separate reference voltage $V_R$ typically 6 volts, is also fed into differential amplifier 4. A DC error signal $S_E$ is generated by the differential amplifier 4 and fed into oscillator 5. The signal $S_E$ is indicative of the deviation of the filter output from a preselected voltage level to indicate voltage drop through the filter from the power source.

The reference signal $S_E$ is utilized by oscillator 5 to establish the frequency of the output correction signal $S_C$ from the oscillator. The output of the oscillator $S_C$ is fed through a charge pump voltage multiplier formed from capacitors $C_1$ and $C_2$ and diodes $D_1$ and $D_2$. In turn, the output of the voltage multiplier controls the gate voltage and conductivity of MOS $FET_1$.

The oscillator 5 is configured to increase the frequency of correction signal $S_C$ when the input signal $S_E$ increases in response to a voltage output drop at T. This causes the charge pump to apply a higher input voltage to capacitor $C_1$ causing greater conductivity of MOS $FET_1$ and therefore an increased conduction between the alternator/battery input 2 and the output 3 to the load. The net result is a decrease in the voltage drop between the $V_I$ and $V_O$. This increased coupling is reflected in the DC error signal $S_E$, as the differential between the sample $O_S$ and the reference $V_R$ is reduced. The circuit stabilizes as the error sign $S_E$ decreases and the differential amplifier comes into equilibrium.

If the output sample $O_S$ decreases significantly to the point that the DC error sign $S_E$ increases to allow extremely high oscillator output frequency $S_R$, the added input to the filter circuit 2 can achieve saturation of the MOS $FET_1$. At this point, virtually no voltage drop will exist between the input from the alternator at $V_I$ and the output to the load at $V_0$. Also, there will be no effective filtering between the alternator output and the audio equipment input. As stated above, the filtering during high amplifier output is not essential as the natural masking effect of the high amplitude audio output will effectively mask the effects of any power line signal noise.

The present invention, in FIG. 2, teaches further circuitry to more fully utilize the advantages of audio feedback. FIG. 2 illustrates the connection of a plurality of audio output channels 9 from the audio output of the audio load 7. The various channel outputs are summed by an electrical summing circuit 6 and fed through rectifier 8 to the oscillator 5 in combination with the DC error signal $S_E$ from the differential amplifier 4. The augmentation of the differential amplifier output with the summed and rectified audio output signal further regulates the power coupling between the alternator and the audio load 7 through regulation of the MOS $FET_1$. This allows for increased coupling through the MOS $FET_1$ during high power demand conditions to allow for decreased power drop and commensurate decreased filtering during higher audio output when maximum power transfer to the load is desired and a reduction in filtering is acceptable.

As illustrated in FIG. 2 and discussed briefly above, the system can be more accurately responsive to the audio conditions through utilization of the feedback from the audio output added to the DC error correction signal $S_E$ to cause the oscillator 5 to be more responsive to the existing audio conditions. By monitoring the audio output as well as the power signal $O_S$, the frequency of the correction signal $S_C$ can be varied both in response to an output voltage change or an audio level change.

Transistor $Q_1$, shown in FIG. 2, can also be included in the system taught in the present invention to directly control the gate of MOS $FET_1$. In this way, the MOS $FET_1$ acts as an audio system power control switch by preventing power coupling between the input terminal $V_I$ and the load output $V_0$ when $Q_1$ is fully saturated. This eliminates the need for bulky and costly power relay switching circuitry. $Q_1$ can be triggered by any suitable control arrangement, such as through resister $R_5$ by the audio system microprocessor, to act as a power switch for the amplification equipment.

Figure 3:
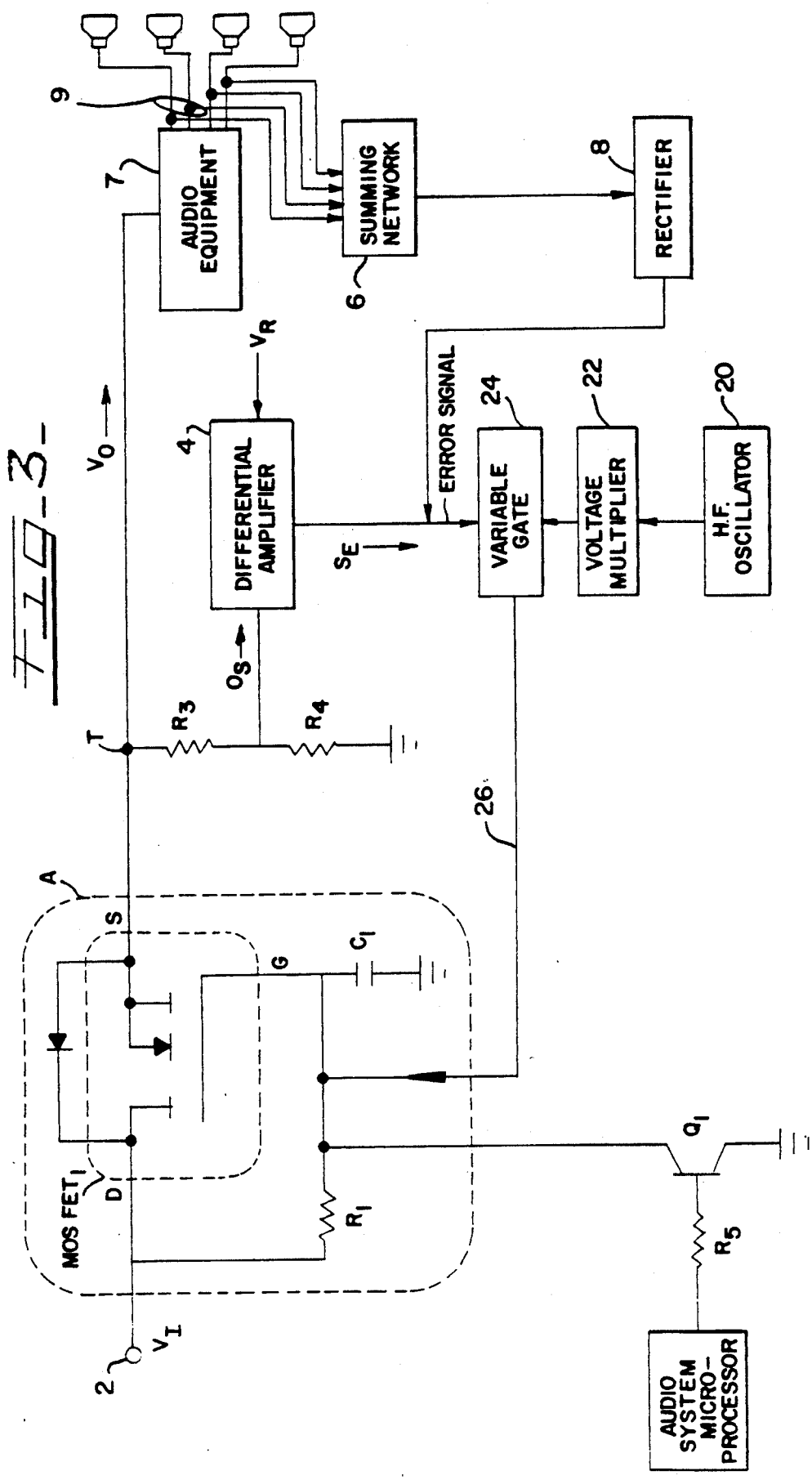
FIG. 3 is a schematic diagram of a modification of the embodiment of FIG. 2 according to the present invention.

FIG. 3 illustrates a modification of the circuit of FIG. 2 in accordance with the present invention. In the circuit of FIG. 3, variable frequency oscillator 5 and associated components, $R_2$, $C_2$, $D_1$, and $D_2$ have been replaced with a circuit by which the FET gate control signal voltage is varied in response to the feedback signals while the frequency thereof remains fixed. This is accomplished by a high frequency oscillator 20 which has its output fed through a voltage multiplier 22 so as to produce a signal at the input of a variable gate circuit 24 which, is a typical 12 volt automotive system, would have a voltage of approximately 24 volts.

The error control signal $S_E$ from differential amplifier 4 and rectifier 8 is fed to a control input of gate 24 such that the output of the gate on line 26 will vary within the range of typically 12 to 24 volts. This signal is then fed directly to gate G of MOS $FET_1$ to produce the same beneficial effects discussed above with respect to the embodiment of FIG. 2.

In the embodiment of FIG. 3, the output frequency of the oscillator is fixed but the gate control voltage is caused to vary directly. This circuitry has the additional advantage of being more easily integratible due to the absence of large size components.

The circuitry of the present invention as described above, can be implemented as a portion of an integrated circuit chip, as an individual circuit, or as an arrangement of discrete circuit elements. At desirable audio frequencies, the above described circuitry and method of the present invention will achieve improved filtering in a range of 40 to 80 dB better than the utilization of practical LC filtering techniques, at less weight, less bulk, less power loss, and considerably improved overall efficiency as compared to known prior art techniques.

Inasmuch as the present invention is subject to many variations, modifications and changes in detail, it is intended that all matter contained in the foregoing description or shown in the accompanying drawings shall be interpreted as illustrative and not in a limiting sense.

What is claimed is:

1. An adaptive power line filter for an audio reproduction system, comprising:
   an input port which may be operably connected to a power line in order to accept an input voltage;
   an output port for outputting an output voltage to a load;
   a variable conductivity element interposed between said input and output ports, wherein the conductivity of said conductivity element varies in accordance with a voltage applied to a gate of said conductivity element;
   a filter network for filtering the input voltage and applying the filtered voltage to the gate of said conductivity element so that the output voltage is a filtered version of the input voltage; and,
   a feedback network for producing a control signal in accordance with the difference between the output voltage level and a predetermined reference voltage level, the control signal then being applied to the gate of said conductivity element so that the input voltage is filtered less as the output voltage level increases.

2. The invention as recited in claim 1, wherein said variable conductivity element comprises an MOS field effect transistor.

3. The invention as recited in claim 1, wherein said feedback network comprises a comparator coupled to the output voltage of said output port for comparing the same to a reference signal.

4. The invention as recited in claim 3, wherein said feedback network further comprises a variable charge pump multiplier responsive to the output of the comparator for producing said control signal, said variable charge pump multiplier including a variable frequency oscillator.

5. The invention as recited in claim 4, wherein said feedback network further comprises a circuit adding a signal representative of the output of the audio reproduction system to the output of the comparator.

6. The invention as recited in claim 3, wherein said feedback network further comprises a means for coupling the output of the comparator to the gate of said MOS field effect transistor.

7. An adaptive power line filter for an audio reproduction system, comprising:
   a first circuit for accepting a power input from a power line and outputting a filtered power output wherein a variable degree of line filtering is provided in response to a control signal; and
   a second circuit for generating said control signal in response to the voltage drop across said first circuit between the power input and the power output and an output of the audio reproduction system, whereby efficient line filtering is provided at low audio output levels and losses associated with line filtering are reduced at high audio output levels without perceptible degradation of audio fidelity.

8. The invention as recited in claim 7, wherein said first circuit includes a filter network and a variable transconductance semiconductor.

9. The invention as recited in claim 7, wherein said second circuit includes a reference signal and a comparator for comparing the output of the first circuit with said reference signal.

10. The invention as recited in claim 9, wherein the second circuit further includes an oscillator having an output signal the frequency of which varies in response to the output of the comparator.

11. The invention as recited in claim 8, wherein said second circuit comprises a differential amplifier for comparing the output of said first circuit with a predetermined reference voltage and an oscillator for producing said control signal in accordance with the output of said differential amplifier.

12. An adaptive power line noise filter, comprising:
   a power input;
   a power output;
   a filter network coupled between said power input and said power output, said filter network providing a variable degree of transconductance therethrough in response to a variable control signal;
   a comparator coupled to said power output for sampling said power output, comparing said sampled output to a reference and producing a sampling signal indicative of said comparison; and a compensator connected to said filter network and said comparator for receiving said sampling signal and generating said variable control signal in response to said sampling signal.

13. The filter of claim 12, wherein said compensator includes a variable frequency oscillator.

14. The filter of claim 12, further comprising a switch network for disabling said filter network.

15. The filter of claim 12, further comprising a circuit for measuring a level of an audio output of a unit of audio reproduction equipment and for modifying said variable control signal in response to said measured audio output level.

16. The filter of claim 12, wherein said filter network includes an MOS field effect transistor.

* * * * *